US005545473A

United States Patent [19]

Ameen et al.

[11] Patent Number: 5,545,473
[45] Date of Patent: Aug. 13, 1996

[54] THERMALLY CONDUCTIVE INTERFACE

[75] Inventors: Joseph G. Ameen, Bear, Del.; William P. Mortimer, Jr., Conowingo, Md.; Victor P. Yokimcus, Newark, Del.

[73] Assignee: W. L. Gore & Associates, Inc., Newark, Del.

[21] Appl. No.: 196,048

[22] Filed: Feb. 14, 1994

[51] Int. Cl.$^6$ .................................................. B32B 5/16
[52] U.S. Cl. ...................... 428/283; 428/212; 428/304.4; 428/317.9; 428/318.4; 428/319.1; 428/323; 428/329; 428/421; 428/422; 428/901
[58] Field of Search .......................... 428/317.9, 318.4, 428/319.1, 323, 329, 331, 421, 422, 283, 320.2, 304.4, 212, 901

[56] References Cited

U.S. PATENT DOCUMENTS

| | | | |
|---|---|---|---|
| 4,008,300 | 2/1977 | Pomm | 264/104 |
| 4,265,775 | 5/1981 | Aakalu et al. | 252/573 |
| 4,557,957 | 12/1985 | Manniso | 428/36 |
| 4,574,879 | 3/1986 | DeGree et al. | 165/185 |
| 4,598,011 | 7/1986 | Bowman | 428/222 |
| 4,602,678 | 7/1986 | Fick | 165/79 |
| 4,606,962 | 8/1986 | Reylek et al. | 428/148 |
| 4,669,954 | 6/1987 | Habarou et al. | 415/174 |
| 4,810,563 | 3/1989 | DeGree et al. | 428/209 |
| 4,820,376 | 4/1989 | Lambert et al. | 156/643 |
| 4,853,763 | 8/1989 | DeGree et al. | 357/81 |
| 4,902,857 | 2/1990 | Cranston et al. | 174/94 R |
| 4,961,064 | 10/1990 | Hara | 338/231 |
| 4,985,296 | 1/1991 | Mortimer, Jr. | 428/220 |
| 4,999,741 | 3/1991 | Tyler | 361/387 |
| 5,001,302 | 3/1991 | Atsumi | 174/94 R |
| 5,011,872 | 4/1991 | Latham et al. | 523/440 |
| 5,028,984 | 7/1991 | Ameen et al. | 357/72 |
| 5,045,249 | 9/1991 | Jin et al. | 264/24 |
| 5,060,114 | 10/1991 | Feinberg et al. | 361/387 |
| 5,084,211 | 1/1992 | Kawaguchi et al. | 252/511 |
| 5,137,283 | 8/1992 | Giarrusso et al. | |
| 5,209,967 | 5/1993 | Wright et al. | 428/283 |
| 5,213,868 | 5/1993 | Liberty et al. | 428/131 |
| 5,227,230 | 7/1993 | McGlade | 428/319.1 |

FOREIGN PATENT DOCUMENTS

| | | |
|---|---|---|
| 0322165 | 6/1989 | European Pat. Off. |
| 1012406 | 1/1989 | Japan. |
| 3137138 | 6/1991 | Japan. |
| 2219133 | 11/1989 | United Kingdom. |

OTHER PUBLICATIONS

IBM Technical Disclosure Bulletin; "Thermally Conductive, Removable, Elastomeric Interposer for Chip-to-Heat Sink Attachment"; vol. 35, No. 7, Dec. 1992, pp. 241–242.

"Thermal Gap Fillers", Electronic Packaging and Production, vol. 33, No. 8, Aug. 1993, p. 55.

Data Sheet: "Adhesive Interconnect Systems 5303R Z-Axis Adhesive Film (ZAF)"; 3M; Jan. 5, 1993; Revision 002.

"Effective Polymer Adhesives For Interconnect" by Kreutter, et al.; 3M; Date: Unknown.

NUGGETS Unitek Equipment Technical Services Bulletin 9202A; Unitek Equipment, Inc. "3M Anisotropic (Conductive) Adhesive".

Article: "Z-Axis Adhesive Film: Innovation in Electronic Interconnection"; Bruce Grove; *InterConnection Technology* Dec. 1992.

(List continued on next page.)

*Primary Examiner*—James J. Bell
*Attorney, Agent, or Firm*—David J. Johns

[57] ABSTRACT

A thermally conductive interface is provided suitable for thermal conduction, especially between electronic components. The preferred thermally conductive interface comprises an open structure fluoropolymer material, such as expanded polytetrafluoroethylene, with uncoated thermally conductive particles attached to solid portions thereof. The interface has numerous benefits over previously available material, such as improved thermal conductivity, high conformability, better compressibility, inherent porosity so as to provide air relief, improved stress relief, and high material compliance and resistance to fatigue during thermal cycling.

21 Claims, 2 Drawing Sheets

OTHER PUBLICATIONS

"Portable Electronics Packaging Project"; Microelectronics and Computer Technology Corporation; Bert Haskell; Sep. 1992.

"Interconnection Method of Liquid Crystal Driver LSIs By Tab–On–Glass and Board To Glass Using Anisotropic Conductive Film And Monosotropic Heat Seal Connectors" Roger R. Reinke, Elform, Incorporated: pp. 1–7.

"Prediction and Measurement of Thermal Conductivity of Diamond Filled Adhesives" by Justin C. Bolger, Emerson & Cuming, Inc.; pp. 219–224; 1992.

CHO–THERM® Thermal Interface Materials; Grace Company; Date: Unknown.

"Silicones with Improved Thermal Conductivity for Thermal Management in Electronic Packaging"; Adam L. Peterson; Dow Corning Corporation; pp. 613–619; Date: Unknown.

"SIL–PAD® Design Guide"; The Bergquist Company; Date: Spring, 1993; pp. 1–23.

"Elastomeric Connector User Design Card"; PCK Elastomerics, Inc.; Date: Unknown.

THERMALLY CONDUCTIVE INTERFACE

BACKGROUND OF THE INVENTION

1. Field of the Invention

The present invention relates to electrical interfaces and particularly to thermally conductive interfaces for use in a variety of electronic products.

2. Description of Related Art

Integrated circuit ("IC") chips are steadily become more powerful while being compacted into smaller and smaller packages. When compared to previous integrated circuit chips, this trend produces integrated chips which are significantly denser and which perform many more functions in a given period of time—resulting in an increase in the current they use. Consequently, smaller and faster chips tend to run significantly hotter than previous products.

As a result, heat management in electronic products has become a chief concern in product design. Reliability of electronic circuits tends to be tied to proper matches in the coefficients of expansion of various electronic components. As the temperature rises, mismatches in the coefficients of expansion cause stresses to develop between adjoining members. Under these circumstances, any increase in operating temperature will have a negative effect on reliability.

In an effort to control heat better, the use of various heat sinks is now a central focus in electronic equipment design. Examples of common heat sinks employed today include: various filled products, such as epoxies, thermosets, silicones, and thermoplastics; IBM Thermal Conductive Modules (ITCM); Mitsubishi High Thermal Conduction Modules (HTCM); Hitachi SiC Heat Sink; Fujitsu FACOM VP2000 Cooling Mechanism; etc.

In order to mate IC chips to heat sinks successfully, a interface which is elastic or otherwise conformable is preferred so as to ease installation and to minimize the effect of expansion and contraction between electronic components. Air gaps formed from inapt installation of a chip to a heat sink, and/or expansion and contraction cycles during operation, can greatly impede the flow of heat from the device. Conformability becomes especially important when the tolerances on the heat sink and chip tilt (in the case of flip chips) become large.

Typically, thermal greases or thermally conductive thermosetting materials are used to take up tolerances between electronic components. See, e.g., U.S. Pat. No. 5,028,984 to Ameen et al. While such materials may work well for some applications, they continue to have a number of drawbacks. These materials tend to be hard to control and are prone to contaminating components of the electronic device. For instance, care must be taken when using these materials to prevent unwanted contamination of solder joints and, in the case of electrically conductive thermoset resins, unwanted contamination of adjacent conductors. In practice, this usually results in a significant amount of wasted material. Additionally, clean up often requires the use of either unsafe or environmentally unsound solvents.

In U.S. Pat. No. 5,187,283 to Giarusso et al. a gasket-type material is disclosed comprising a thin-film surrounding a meltable metal core. In operation, the gasket is installed as an interface and its temperature is increased to melt the metal core and allow it to conform to the component parts. Unfortunately, this construction is believed to be ineffective in avoiding air gaps that can form during normal thermal cycling of the device. Further, as is a common problem with solid gasket materials in general, it is believed that this device may experience limited compressibility, requiring either application of excessive pressure to the mating surfaces, or use of unacceptably thick sections of the gasket.

In U.S. Pat. No. 5,060,114 to Feinberg et al., conformability is sought by curing a metal or metal oxide filled silicone around the component to be cooled. Although this method may be successful, it is believed to be unduly complicated, costly, and time consuming for practical widespread use.

In addition, with most thermoset resins, greases, and gaskets employing a filler there are additional constraints in successful heat dissipation. Most fillers tend to coat each individual particle of the thermal conductor within the resin—essentially insulating the conductor. This greatly reduces the overall effective thermal conductivity of the product in at least two ways. First, even a thinly coated surface (e.g., with a layer of silicone or epoxy) can serve as a thermal insulator, reducing the effective thermal conductivity of the product, particularly at contacting surfaces. Second, in order to overcome such thermal insulation, it is often necessary to apply substantial pressure to the interface in order to urge the thermally conductive particles into direct contact with one another to produce the necessary amount of conduction through the material. This often requires unacceptable compressive force for integrated circuits to produce a viable thermally conductive interface.

As a result, most commercially available products can produce a conductivity in the range of only about 1.8 W/M °K. (for greases) to 2.2 W/M °K. (for epoxies). Even the most advanced (and expensive) materials, such as silver filled epoxies, can achieve a conductivity in the range of 3–4 W/M °K. With regard to easily handled materials, such as self-adhesive materials available from Chomerics, Inc., Woburn, Mass., under the trademark CHO-THERM Thermal Interface Materials, and from The Bergquist Company, Minneapolis, Minn., under the trademark SIL-PAD Thermal Management Materials, these can typically achieve a conductivity of only about 0.37–0.95 W/M °K. and 0.6–1.5 W/M °K., respectively. Although these commercial materials can produce better conductivities at high mounting pressures, they deliver extremely poor conductivity at low mounting pressures (e.g., pressures below 2–3 lbs/in$^2$).

Other problems experienced by many commercially available thermoset resins include: inadequate conformability (i.e., excessive compressive force to get higher thermal conductivity); high flexural modulus after curing—resulting in substantial stress upon devices during thermal cycling; a lack of "compliance," resulting in stress fractures if the resin is flexed longitudinally after curing; long curing times; and difficulty in manufacturing in high volumes.

Accordingly, it is a primary purpose of the present invention to provide a thermally conductive interface which delivers relatively even heat dissipation and reduces the negative impact of flex and fatigue.

It is another purpose of the present invention to provide a thermally conductive interface which is conformable to provide a good fit between component parts without requiring undue compressive force to achieve the desired amount of thermal conductivity.

It is still another purpose of the present invention to provide a thermally conductive interface which is compliant, allowing the material to be more forgiving to longitudinal stresses.

These and other purposes of the present invention will become evident from review of the following specification.

SUMMARY OF THE INVENTION

The present invention is an improved thermally conductive interface combining high thermal conductivity with substantial conformability.

The present invention is a departure from many previous thermally conductive interfaces in that the thermally conductive particles are entrapped in solid portions of an open polymer support structure without the need for completely coating the particles with thermally non-conductive polymer. As a result, better particle-to-particle contact, as well as interface-to-component contact, is established to improve thermal transfer through the interface. The improved thermal interface of the present invention also permits effective installation with significantly less compressive force than presently available interfaces.

Additionally, by employing a compressible structure as a support material, such as expanded polytetrafluoroethylene (PTFE) or similar fluoropolymer, the interface of the present invention is provided with a significant degree of flexibility. This allows the interface to conform readily to provide a tight junction between component parts, reducing inefficiencies due to air gaps while providing a buffer between component parts during thermal cycling. The flexibility of the interface also provides far greater tolerances for longitudinal flexing and material fatigue during thermal cycling. Finally, through use of a porous fluoropolymer, a ready mechanism for air relief is also provided.

DESCRIPTION OF THE DRAWINGS

The operation of the present invention should become apparent from the following description when considered in conjunction with the accompanying drawings, in which.

DETAILED DESCRIPTION OF THE INVENTION

The present invention comprises a thermally conductive interface for mounting between a variety of component parts to assist in the transference of heat energy.

Figure 1:
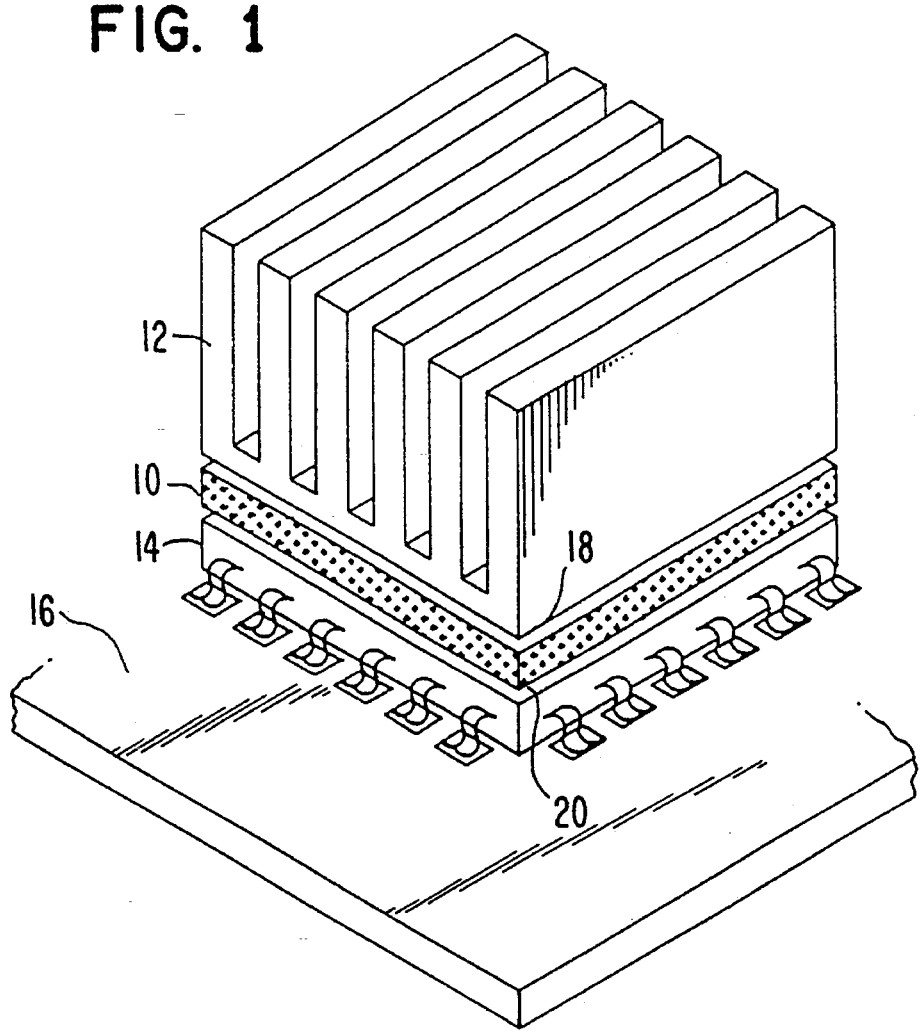
FIG. 1 is a three-quarter isometric view of one embodiment of a thermally conductive interface of the present invention shown mounted between component parts of an electronic device.

Shown in FIG. 1 is a thermally conductive interface 10 of the present invention mounted between two representative components, a heat sink 12 and a integrated circuit 14, on an electronic circuit board 16. Unlike many presently available thermally conductive interfaces, the present invention provides exceptional conformability between component parts. As a result, with minimal compressive pressure, the interface 10 of the present invention forms a tight connection between the interface 10 and abutting surfaces 18, 20 of each of the components with little or no air spaces present to disrupt thermal conductivity.

As the term "tight" is used to describe the connection achieved between component parts using the interface of the present invention, it is meant to encompass a junction between component parts whereby the interface material has conformed to fill in irregularities in the surfaces of the component parts and significantly reduce or eliminate any air spaces therebetween. The interface of the present invention is particularly effective at establishing a tight connection at relatively low mounting pressures. As the term "low mounting pressures" is used in this application, it is intended to encompass the restricted pressures that sensitive electronic products (e.g., silica IC chips) can withstand, and includes pressure below about 30 lb/in$^2$ (147 kg/m$^2$).

Figure 2:
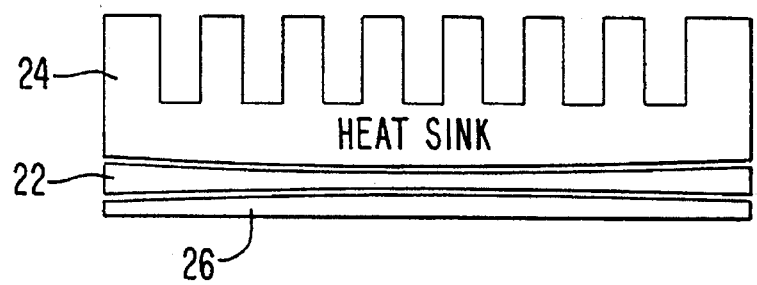
FIG. 2 is a cross-sectional view of another embodiment of a thermally conductive interface of the present invention shown mounted between two component parts of an electronic device.

The interface 10 of the present invention can be formed in a variety of shapes and sizes to fill particular needs. Shown in FIG. 2 is another embodiment of a thermally conductive interface 22 of the present invention. In this instance, the interface 22 is deformed to provide a compliant connection between a heat sink 24 and an electronic component 26.

The preferred construction of the interfaces of the present invention comprises a fluoropolymer material having fine thermally conductive particles embedded therein. The thermally conductive particles preferably have the following properties: high thermal conductivity (e.g., in the range of 9.9 to 2000 W/M °K.); particle size of <1 micron up to about 44 micron; and good packing characteristics. In order to achieve vastly improved packing characteristics, it is preferred that the particles comprise a number of different average sizes (e.g., being bi-modal or tri-modal) so that unfilled air spaces between particles can be minimized.

Preferred particles for use with the present invention include: metals, such as aluminum (Al), copper (Cu) or nickel (Ni), or zinc (Zn); metal oxides, such as zinc oxide, copper oxide, and aluminum oxide; or other thermally conductive, electrically non-conductive material, such as boron nitride (BN), aluminum nitride (AlN), diamond powder, and silicon carbide (SiC).

As is explained in more detail below, the thermally conductive particles provide primary heat transfer by being in direct contact with one another. In presently available thermally conductive interfaces this heat transfer mechanism is hindered by the fact that the particles have to be held in place through some means such as by filling into epoxies, silicones, or other polymers. The polymer coating tends to coat the particles and thereby reduce the thermal conductivity of the system. To overcome this condition, proper thermal conductivity often requires that an excessive amount of compressive pressure be applied to the interface to crush the particles into correct orientation.

In one embodiment of the present invention, the particles are entrapped in the fluoropolymer support material itself without being completely coated by a thermally non-conductive material. The fluoropolymer material serves as an support to contain the thermally conductive particles and hold them in proper alignment between the component parts. As such, ideally the fluoropolymer material has an open structure which is easily compressed to place the thermally conductive particles in direct contact with one another.

Ideally, the fluoropolymer material is a porous polytetrafluoroethylene (PTFE), and especially an extruded and/or expanded PTFE, such as that taught in U.S. Pat. No. 3,953,566 to Gore. The preferred material comprises a porous expanded PTFE which has been stretched at least 2 to 4 times its original size in accordance with U.S. Pat. No. 3,953,566. This stretching created pores that act as natural air reliefs when the filled material is urged between two components. In addition, because of the nature of the expanded PTFE, stresses created due to mismatches in the thermal coefficients of expansion between component parts may be relieved in this conductive layer if it placed between them.

Examples of interface compositions suitable for use with the present invention are set forth below. In the simplest form of the present invention, the interface comprises PTFE with about 50 to 60% by volume of the solid components of ZnO, BN, or any other good thermally but electrically non-conductive filler. The final product may be expanded in ratios of 4:1 or 3:1 or 2:1 to achieve the desired degree of conformability. As has been noted, the presence of the pores created from the expansion process is responsible for the conforming nature of the finished product and aids in the relief of trapped air when this material is placed between two parallel plates and then are urged together. These materials may be formed into any suitable shape, such as thin tapes having thicknesses in the 5 to 15 mil (0.127 to 0.381 mm) range.

Another suitable composition for use in the present invention involves filling the PTFE with a metal powder, such as copper or nickel, having particle sizes in the 1 to 40 micron range. Bimodal and trimodal distributions can increase the loading of this material, such as providing particles in the 1 to 5 micron range mixed with particles in the 40 to 45 micron range. This allows greater packing density, with a subsequent increase in thermal conductivity without sacrificing conformability. The total volume percent (including air) of metal to finished filled PTFE is in the 20 to 90% range. The finished material may also be further plated with more metal such as tin/lead, copper, or nickel to further increase the materials thermal properties.

Materials made from either of the above described methods may then be laminated together to create a good thermally conductive material that is electrically insulating. By laminating one of these materials under pressure to a more thermally conductive material, such as, but not limited to, copper, aluminum, silicon carbide, metal matrix composites, or high oriented carbon fibers in a metal matrix, a further improved material may be achieved.

To improve conductivities further, the pores created by stretching may be backfilled with a liquid to reduce or eliminate air spaces therein and improve thermal conductivity. For instance, a liquid may comprise any of the following: a high molecular weight silicone oil having a mono-modal molecular weight distribution so as to reduce silicone oil migration and evaporation (e.g., Dow Corning's DC 200 oil having a viscosity in the 10,000–100,000 centistoke range); FREON fluorocarbon liquid or KRYTOX hexafluoropropylene epoxide polymer oil, each available from E. I. duPont de Nemours and Company, Wilmington, Del.; FOMBLIN perfluoropolyether oil available from Ausimont U.S.A., Morristown, N.J.; or similar materials.

The filler may be placed within the structure through a variety of means, including employing simple diffusion, injecting under pressure, drawing under a vacuum, driving in by means of ultrasonics, employing a solvent to facilitate transport, or spreading across the surface (such as with a doctor's blade). In addition, PTFE filled with pure metals may be electrolessly or electrolytically plated to add more metal to the finished product. This, of course, being done to thermally conductive interfaces that may be electrically conductive as well.

Finally, the filled materials may be laminated to other filled materials, e.g., metal filled PTFE to metal oxide filled PTFE, or to pure metals such as copper or aluminum, or to hybrid materials such as silicon carbide, metal matrix composites, or highly oriented carbon fiber to achieve greater conductivity.

It should be further understood by one skilled in the art that any combinations of these alternatives can be used to enhance conductivity. For example, a metal filled material may be plated, then laminated to a metal foil, and then may be filled with the silicone oil.

With any of the above compositions, if required, a light adhesive may be applied on one or both surfaces of the composite material to aid in the assembly of electronic devices.

Figure 3:
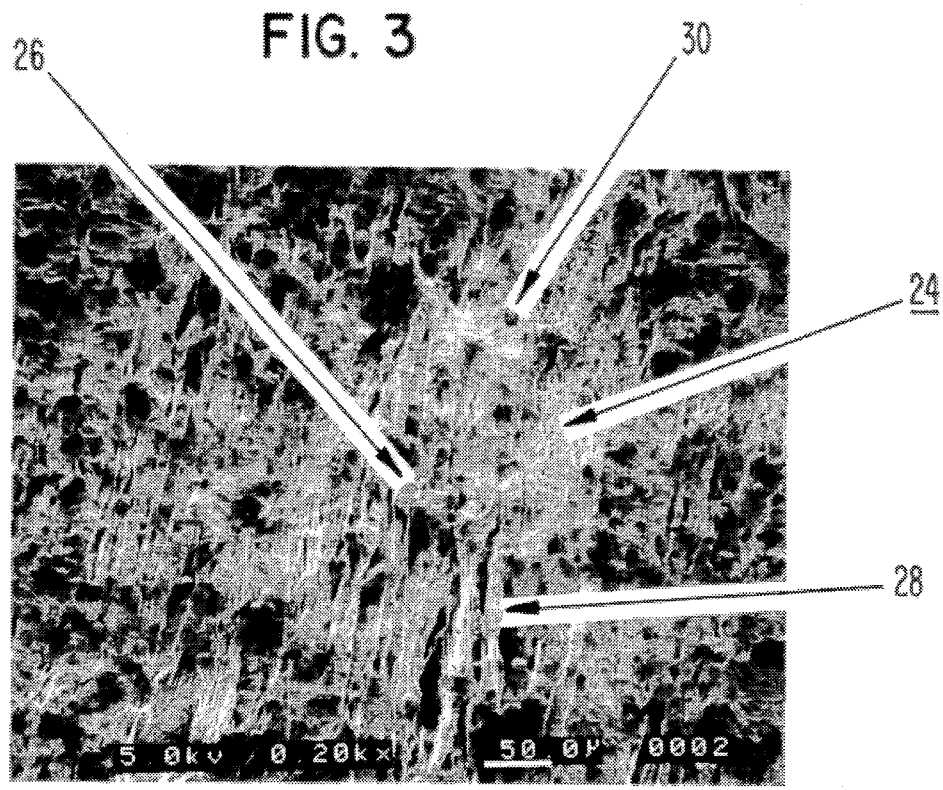
FIG. 3 is a scanning electron micrograph (SEM), enlarged 200 times, of a thermally conductive interface of the present invention.
Figure 4:
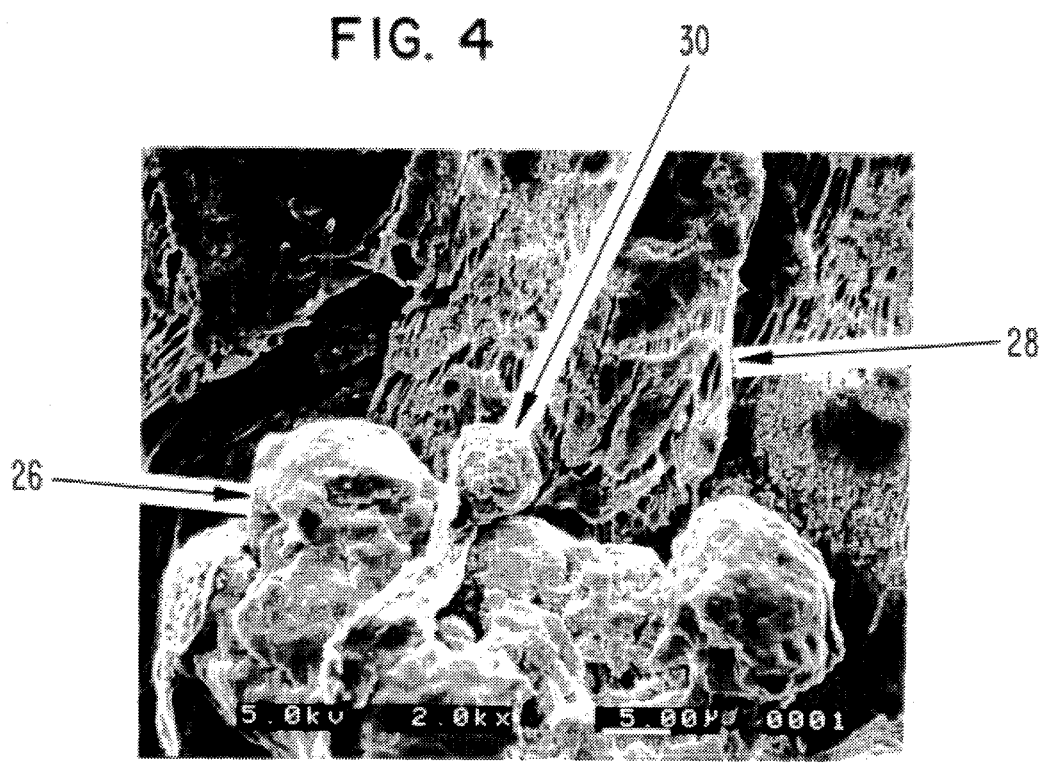
FIG. 4 is a SEM, enlarged 2000 times, of a thermally conductive interface of the present invention, showing thermally conductive particles embedded within nodes of the fluoropolymer membrane.

The construction of the interface of the present invention is best illustrated by the scanning electron micrographs (SEMs) of FIGS. 3 and 4. As is shown in the SEMs, an expanded PTFE fluoropolymer material 24 comprises a network of nodes 26 interconnected by fibrils 28. When formed in the manner described above, the thermally conductive particles 30 become enmeshed within polymer structure, including becoming directly attached or embedded in some of the nodes 26, and thus become secured within the fluoropolymer material. Unlike some previous interfaces, particle retainment with the present invention does not require any coating of or interference with the thermal conductivity of the particles. This method of construction also allows the particles to remain exposed even on the surface of the interface, thus providing direct contact between the interface and the component surfaces.

The present invention demonstrates improvements over commercial products presently available. The interfaces produce in accordance with the present are the only interfaces which combine all of the following properties: a thermal conductivity of $\geq 0.5$ W/M °K.; substantial compliance; substantial conformability; porosity to provide stress relief; and ease in application. The combination of these characteristics provide a thermal path that is believed to have the lowest thermal impedance possible.

Without intending to limit the scope of the present invention, the process of making and using the present invention may be better understood by reference to the following examples:

EXAMPLE 1

A slurry of 2240 g of zinc oxide grade Z-52 obtained from Fisher Scientific Company of Pittsburgh, Pa., and 23,800 ml of deionized water was prepared in a 30 liter container. While the slurry was agitated at 300 rpm, 560 g of PTFE in the form of 29.4% solids PTFE dispersion was rapidly poured into the mixing vessel. The PTFE dispersion was an aqueous dispersion obtained from E. I. duPont de Nemours Company, Wilmington, Del. The mixture was self-coagulating and within 1 minute the coagulum had settled to the bottom of the mixing vessel and the water was clear.

The coagulum was dried at 165° C. in a convection oven. The material dried in small, cracked cakes approximately 2 cm thick and was chilled to below 0° C. The chilled cake was hand ground using a tight, circular motion and minimal downward force through a 0.635 cm mesh stainless steel screen, the 0.267 g of mineral spirits per gram of powder was added. The mixture was chilled, again passed through a 0.635 cm mesh screen, tumbled for 10 minutes, then allowed to sit at 18° C. for 48 hours and was retumbled for 10 minutes.

A pellet was formed in a cylinder by pulling a vacuum and pressing at 800 psi. The pellet was then heated in a sealed tube. The pellet was then extruded into tape form.

The tape was then calendered through heated rolls. The lubricant was then evaporated by running the tape across heated rolls. Tape thickness was about 11.7 mils after drying.

EXAMPLE 2

The tape produced in Example 1 was then filled using a silicone oil to fill all air spaces therein. Approximately 1 g of a Dow Corning DC 200 silicone oil (30 kcs) was applied to both sides of the tape using a doctor blade until the silicone oil coated the interface and filled most of the voids therein. The interface comprised a thickness of about 11.5 mils after this procedure.

EXAMPLE 3

A slurry of 4376 g of boron nitride grade HCP obtained from Advanced Ceramics Company of Cleveland, Ohio, and 55,000 ml of deionized water was prepared in a 30 liter container. While the slurry was agitated at 300 rpm, 4,324 g of PTFE in the form of 15.7% solids PTFE dispersion was rapidly poured into the mixing vessel. The PTFE dispersion was an aqueous dispersion obtained from ICI Americas, Inc., Bayonne, N.J. The mixture was self-coagulating and within 1 minute the coagulum had settled to the bottom of the mixing vessel and the water was clear.

The coagulum was dried at 165° C. in a convection oven. The material dried in small, cracked cakes approximately 2 cm thick and was chilled to below 0° C. The chilled cake was hand ground using a tight, circular motion and minimal downward force through a 0.635 cm mesh stainless steel screen, the 0.267 g of mineral spirits per gram of powder was added. The mixture was chilled, again passed through a 0.635 cm mesh screen, tumbled for 10 minutes, then allowed to sit at 18° C. for 48 hours and was retumbled for 10 minutes.

A pellet was formed in a cylinder by pulling a vacuum and pressing at 800 psi. The pellet was then heated in a sealed tube. The pellet was then extruded into tape form.

The tape was then calendered through heated rolls. The lubricant was then evaporated by running the tape across heated rolls. Tape thickness was 10.5 mils after drying.

EXAMPLE 4

The tape of Example 3 was stretched in accordance with U.S. Pat. No. 3,953,566 to Gore, incorporated by reference, under the following expansion conditions: ratio of 2:1 across metal rolls heated to 270° C. with an input speed of 52.5 ft/min and an output speed 105 ft/min.

EXAMPLE 5

A slurry of 301.7 g of −325 mesh copper powder and 5.1 g of <7 micron copper powder and 920 g of deionized water was prepared in a 2 liter baffled stainless steel container. Copper powder was purchased from SCM Metal Products Inc. of Research Triangle Park, N.C. After 1 minute of mixing, 18.2 g of PTFE solids in the form of 25.0% dispersion was rapidly poured into the mixing vessel. The dispersion was obtained from E. I. duPont de Nemours and Company, Wilmington, Del. After 10 seconds, 38.3 g of SEDIPUR 803 modified cationic surfactant was poured into the mixture. The mixture coagulated rapidly. After stopping, the mixing process, the coagulum settled to the bottom and the effluent was clear.

The coagulum was dried at 165° C. in a convection oven. The material dried in small, cracked cakes and was chilled to below 0° C. The chilled cake was hand ground using a tight, circular motion and minimal downward force through a 0.635 cm mesh stainless steel screen, then 75 cc of a mixture of 2 parts propylene glycol (PPG) and 1 part isopropanol (IPA) per pound of mix was added. The mixture was chilled, again passed through a 0.635 cm mesh screen, tumbled for 10 minutes, then allowed to sit at 18° C. for 48 hours and was retumbled for 10 minutes.

A pellet was formed in a cylinder by pulling a vacuum and pressing at 250 psi. The pellet was then heated in a sealed tube. The pellet was then extruded into tape form.

The tape was then calendered through heated rolls to 15 ml. The lubricant was then evaporated by running the tape across steam heated plates at 250° C. Tape thickness was 10.9 mils after drying.

Measuring Procedure:

Samples of the material are cut into 5 inch squares and placed on a 5 inch by 5 inch heated platen. A heat sink with thermocouple sensors is placed on top of the test sample (reference ASTM E 1225-87, Thermal Conductivity of Solids by Means of the Guarded-Comparative-Longitudinal Heat Flow Technique, and ASTM C 177-85 Steady State Heat Flux Measurements and Thermal Transmission Properties by Means of the Guarded-Hot-Plate Apparatus). A muffin fan, to reduce the effects of temperature fluctuations in the room, is placed on top of the heat sink. The sample is heated and the heat flow and change in temperature are monitored by means of the aforementioned thermocouples. When equilibrium has been reached the heat flow and temperature are noted and inserted in the Fourier's conduction equation for one-dimensional, steady state heat flow. That is:

$$k = \frac{\Delta Q/A \times \text{sample thickness}}{\Delta T}$$

where k=thermal conductivity $\Delta Q/A$=heat flow from test machine $\Delta T$=temperature from test machine The test machine is International Thermal Instruments Company (Del Mar, Calif.) Model C-600-S Thermal Conductivity Cell, or similar device.

Testing followed the procedures dictated by the manufacturer of the Thermal Conductivity Cell. First, the machine was calibrated. Next the sample was loaded and the test begun. The first reading was taken after 30 minutes and subsequent readings were taken every 15 minutes thereafter. The reported value was the reading after the machine reached equilibrium (about 1.5 hours per sample).

The following test results were achieved on each of the samples from the above Examples. Thermal conductivity (K.) (W/M °K.) was measured without pressure and by placing the samples under the pressures indicated. Comparative materials were acquired from Chomerics, Inc., Woburn, Mass., and from The Bergquist Company, Minneapolis, Minn.

| SAMPLE | THICKNESS (inches) | K (W/M °K.) | K @ 2.16 psi | K @ 2.6 psi | K @ 25 psi |
|---|---|---|---|---|---|
| EXAMPLE 1 | 0.0117" | | 0.12 | | |
| EXAMPLE 2 | 0.0115 | 0.08 | | | 0.325 |
| EXAMPLE 3 | | | | | 0.203 |
| EXAMPLE 4 | 0.0098 | 0.04 | | 0.06 | |
| EXAMPLE 5 | 0.0134 | 0.17 | | 0.28 | |

-continued

| SAMPLE | | | | |
|---|---|---|---|---|
| BERGQUIST PPK10AC | 0.0080 | 0.04 | 0.14 | 0.16 |
| BERGQUIST K10 | 0.0065 | 0.06 | 0.10 | |
| CHOMERICS T404 | 0.0050 | 0.01 | 0.02 | |
| CHOMERICS T405 | 0.0061 | 0.01 | 0.03 | |

| SAMPLE | K AFTER PRESSURE REMOVED | THICKNESS AFTER TEST |
|---|---|---|
| EXAMPLE 1 | 0.08 | 0.0112" |
| EXAMPLE 2 | 0.13 | |
| EXAMPLE 3 | | |
| EXAMPLE 4 | 0.05 | 0.0090 |
| EXAMPLE 5 | 0.24 | 0.0135 |
| BERGQUIST PPK10AC | 0.10 | 0.0080 |
| BERGQUIST K10 | 0.06 | 0.0065 |
| CHOMERICS T404 | 0.02 | 0.0050 |
| CHOMERICS T405 | 0.03 | 0.0061 |

The following three tests are proposed to define conformance and compliance of the interfaces of the present invention. A flat primary test head ("Test Head A" (THA)) should be placed in contact with the interface surface ground to a ±0.001 inch tolerance. Two alternative test heads may also be used to measure the ability of the invention to conform to irregular surfaces. A first test head (Test Head B (THB)) should be surfaced to micro rough texture of 125 microinches. A second test head ("Test Head C" (THC)) should be designed with a ±0.005 inch depressions and extensions.

"Compliancy" is defined as the ability of an interface to fill a gap between two surfaces that are not planar. This can be tested by tilting one surface at a slight angle to its mating surface, such as through insertion of a shim of one third to one half the thickness of the interface between the interface and the two mating surfaces. Thermal conductivity is measured using this set-up and compared to the thermal conductivity of the interface without the shim. A drop of less the 30% the original thermal conductivity was deemed to be "compliant." Preferably, the interface is sufficiently compliant to accommodate a 5 mil (0.127 mm) differential over the length of a 5 inch (127.0 mm) interface.

"Conformability" is defined as the ability of the interface to fill in uneven texturing on a surface. Conformability may be tested using test heads THB and THC. The interface is tested to determine if it can conform to a micro rough surface and a surface with a ±0.005 inch surface. The ±0.005 inch test head is used with test interfaces that are greater than 0.010 inches. The thermal conductivity of the sample can be measured with these two heads and compared to the original thermal conductivity. An interface is deemed conformable if the thermal conductivity does not decrease by more than 30%.

The following tests were performed to test the compliancy of conventional expanded polytetrafluoroethylene (PTFE) material, made in accordance with U.S. Pat. No. 3,953,566 to Gore, incorporated by reference, suitable for use as the fluoropolymer material of the present invention. Thermal conductivity was tested in accordance with the above described test procedure:

| SAMPLE | THICKNESS (inches) | K (W/M °K.) | K @ 2.16 psi | K @ 2.6 psi | K @ 25 psi |
|---|---|---|---|---|---|
| Plain PTFE | 0.0142 | 0.05 | | 0.06 | |
| PTFE w/5 mil shim | 0.0142 | 0.05 | | 0.05 | |
| PTFE w/11 mil shim | 0.0142 | 0.03 | | 0.03 | |

| SAMPLE | K AFTER PRESSURE REMOVED | THICKNESS AFTER TEST |
|---|---|---|
| Plain PTFE | 0.05 | 0.0142 |
| PTFE w/5 mil shim | 0.04 | 0.0142 |
| PTFE w/11 mil shim | 0.03 | 0.0142 |

The thermally conductive interface of the present invention is particularly designed for the dissipation of heat energy from component parts of electronic devices, such as power FET, computer logic circuits, and other high electronic density circuits. It should be understood, however, that applications of the present invention may include a wide selection of other uses, such as: power transformers, transistor packages (such as those designated TO-3, TO-5, TO-18, TO-36, TO-66, TO-220, etc.) and diode packages (such as those designated DO-4, DO-5, etc.).

It should be likewise understood that without departing from the present invention the thermally conductive properties of the present invention may also be employed in the transference of heat to certain component parts, such as heat sinks, cold plates, and the like.

While particular embodiments of the present invention have been illustrated and described herein, the present invention should not be limited to such illustrations and descriptions. It should be apparent that changes and modifications may be incorporated and embodied as part of the present invention within the scope of the following claims.

The invention claimed is:

1. A thermally conductive interface for mounting between electronic component parts which comprises:

a porous fluoropolymer material having a first surface and a second surface, the fluoropolymer material comprising a network of nodes interconnected by fibrils;

thermally conductive particles embedded within the fluoropolymer material between the first and second surfaces at least some of the thermally conductive particles are attached to the nodes;

wherein when the interface is mounted between the component parts, it conforms to provide a tight thermally conductive interface between the component parts and to place thermally conductive particles in direct contact with each of the component parts.

2. The thermally conductive interface of claim 1 wherein the fluoropolymer material comprises an expanded polytetrafluoroethylene (PTFE).

3. The thermally conductive interface of claim 1 wherein the interface includes particles of different sizes mixed therein so as to accommodate greater packing density.

4. The thermally conductive interface of claim 1 wherein the interface is about 0.25 to 0.38 mm thick and has a high heat dissipation rate.

5. The thermally conductive interface of claim 1 wherein the interface is sufficiently conformable to form a tight thermally conductive interface under a pressure of less than about 147 kg/m$^2$ (30 psi).

6. The thermally conductive interface of claim 1 wherein thermally conductive particles are exposed on the first and second surfaces of the fluoropolymer, the particles being substantially free of a thermally insulative coating.

7. The thermally conductive interface of claim 1 wherein the interface is sufficiently compliant to accommodate at least a 0.127 mm (5 mil) differential between one end and another of an interface measuring about 127 mm in length.

8. The thermally conductive interface of claim 1 wherein the fluoropolymer material is porous, providing air relief through the material when the interface is mounted between the component parts.

9. The thermally conductive interface of claim 8 wherein the fluoropolymer material comprises an expanded polytetrafluoroethylene (PTFE).

10. The thermally conductive interface of claim 8 wherein the interface provides relief of stresses generated due to differences in coefficients of expansion between component parts.

11. The thermally conductive interface of claim 1 wherein the interface is sufficiently compliant to fill a gap between two surfaces that are not parallel.

12. The thermally conductive interface of claim 1 wherein thermally conductive particles are substantially free of a thermally insulative coating.

13. The thermally conductive interface of claim 12 wherein the fluoropolymer material includes a network of nodes interconnected by fibrils, and at least some of the thermally conductive particles are attached to the nodes.

14. The thermally conductive interface of claim 13 wherein the interface is porous, providing air relief through the fluoropolymer material when the interface is mounted between the component parts.

15. The thermally conductive interface of claim 1 wherein the thermally conductive particles are selected from the group consisting of zinc oxide, boron nitride, aluminum oxide, copper, nickel, and silicon carbide.

16. A thermally conductive interface comprising:

a porous fluoropolymer material including a network of nodes interconnected by fibrils;

thermally conductive particles contained within the fluoropolymer material, at least some of the particles being embedded within the nodes of the fluoropolymer;

wherein when the interface is mounted between component parts, it conforms to provide a tight thermally conductive interface between the component parts and to place thermally conductive particles in direct contact with each of the component parts.

17. The thermally conductive interface of claim 16 wherein the interface is sufficiently porous as to provide air relief through the fluoropolymer material when the interface is mounted between the component parts.

18. The thermally conductive interface of claim 16 wherein the interface is sufficiently compressible so as to provide a tight seal between the component parts at relatively low mounting pressures of less than 147 g/m$^2$ (30 psi).

19. The thermally conductive interface of claim 16 wherein the interface includes particles of different sizes mixed therein so as to accommodate greater packing density.

20. The thermally conductive interface of claim 1 wherein the porous fluoropolymer material includes a liquid filled therein.

21. The thermally conductive interface of claim 16 wherein the porous fluoropolymer material includes a liquid filled therein.

* * * * *